(12) United States Patent
Bruce et al.

(10) Patent No.: US 6,766,507 B2
(45) Date of Patent: Jul. 20, 2004

(54) MASK/WAFER CONTROL STRUCTURE AND ALGORITHM FOR PLACEMENT

(75) Inventors: James A. Bruce, Williston, VT (US); Stephen E. Knight, Essex Junction, VT (US); Joshua J. Krueger, Burlington, VT (US); Matthew C. Nicholls, South Burlington, VT (US); Jed H. Rankin, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 64 days.

(21) Appl. No.: 10/121,811

(22) Filed: Apr. 12, 2002

(65) Prior Publication Data

US 2003/0196185 A1 Oct. 16, 2003

(51) Int. Cl.[7] ............................................... G06F 17/50
(52) U.S. Cl. ........................................ 716/19; 716/12
(58) Field of Search ........................... 716/2, 4, 12, 19; 257/401

(56) References Cited

U.S. PATENT DOCUMENTS

| | | |
|---|---|---|
| 5,656,403 A | 8/1997 | Shieh |
| 5,798,193 A | 8/1998 | Pierrat et al. |
| 5,800,951 A | 9/1998 | Hashimoto |
| 5,856,927 A * | 1/1999 | Greidinger et al. ........... 716/12 |
| 5,902,703 A | 5/1999 | Leroux et al. |
| 5,962,173 A | 10/1999 | Leroux et al. |
| 5,985,497 A | 11/1999 | Phan et al. |
| 6,030,732 A | 2/2000 | Liu |
| 6,097,073 A * | 8/2000 | Rostoker et al. ............ 257/401 |
| 6,106,980 A | 8/2000 | Pierrat et al. |
| 6,130,016 A | 10/2000 | Kent |
| 6,171,737 B1 | 1/2001 | Phan et al. |
| 6,222,936 B1 | 4/2001 | Phan et al. |
| 6,473,891 B1 * | 10/2002 | Shively ....................... 716/12 |

* cited by examiner

Primary Examiner—Vuthe Siek
Assistant Examiner—Thuan Do
(74) Attorney, Agent, or Firm—Scully, Scott, Murphy & Presser; William D. Sabo, Esq.

(57) ABSTRACT

A mask/wafer control structure and an algorithm for placement thereof provide for data placement of measurement control structures, called a PLS, Process limiting Structure, on a mask and a plurality of chips on the wafer which provide for tighter control of both mask manufacture and wafer production by providing the most critical design structures for measurement during creation of the mask, and in the photolithography and etch processes. The PLS structures are located at multiple locations throughout the chip, and so they receive the same data preparation as the chip, and measurement tools are able to measure the same features at each fabrication step from fabrication of the mask to final formation of the etched features. Manufacturing control and the interlock between the wafer fabrication and the mask fabrication are enhanced, allowing for improved quality of the final product.

6 Claims, 4 Drawing Sheets

MASK/WAFER CONTROL STRUCTURE AND ALGORITHM FOR PLACEMENT

BACKGROUND OF THE INVENTION

1. Field of the Invention

The present invention relates generally to mask/wafer control structures which provide for tighter control of both mask production and wafer production by providing the most critical structures for easily accessible measurement, and an algorithm for data placement of the measurement control structures, termed Process Limiting Structures (PLSs), on a photolithographic mask and subsequently on the printed wafers.

2. Discussion of the Prior Art

In the prior art, mask control is typically performed on either Product Control Images (PCIs) or functional features within a chip, wherein a plurality of individual identical chips are typically arranged in a grid on a wafer. Wafer control is based upon either functional features which are difficult to accurately reproduce or designed control features in the kerf(bergies) which do not receive the same data preparation as the chip features. These variations cause measurement inaccuracies which result in exposing the product to quality control risks. In contrast thereto, the PLS structures of the present invention are located at multiple locations throughout each chip, and they receive the same data preparation as the chip, and measurement tools are able to measure the same features at each fabrication step from fabrication of the mask to final formation of the etched features on the wafer. The PLS structure is typically designed to contain the most critical and challenging structures available on the chip.

The existing PCI control scheme provides control based solely upon a single feature type. In contrast thereto, the PLS contains process limiting structures which are representative of product requirements and can contain representative worst-case allowable and critical structures for accessible measurement. Another disadvantage of the PCI strategy is that PCIs are placed manually. In contrast, the PLS placements of the present invention provide significantly improved coverage over the entire reticle and chip by automating the placement to a desired measurement frequency.

SUMMARY OF THE INVENTION

Accordingly, it is a primary object of the present invention to provide a mask/wafer control structure and an algorithm for placement of the mask/wafer control structures. The subject invention provides for data placement of measurement control Process Limiting Structures (PLSs) on a mask and the resulting chips on a wafer, and provides for tighter control of both mask manufacture and chip/wafer production.

A further object of the subject invention is the provision of a PLS measurement and control structure which contains multiple features which are representative of product requirements and can contain representative worst-case allowable and critical structures for accessible measurement, as well as easily measurable targets for both mask and wafer level production. The PLS control structure allows for a metrology of the most critical and worst-case allowable features in the level for the mask and the chip/wafer. The present invention advantageously positions PLS control structures at many locations throughout and across the field in both sparse/isolated and dense/nested areas; therefore, across field linewidth variation (ACLV) can be monitored through all stages of production, including mask exposure, mask etch, wafer exposure and pattern transfer.

In accordance with the teachings herein, the present invention provides a PLS placement algorithm and process which describe a compliant grid wherein grid points that occupy areas where PLS structures cannot be placed are moved to the nearest area that they can be placed in or are eliminated. This allows the maintenance of an approximate frequency of placement without having to conform to the rigid constraints of a strictly orthogonal grid.

BRIEF DESCRIPTION OF THE DRAWINGS

The foregoing objects and advantages of the present invention for a mask/wafer control structure and an algorithm for placement thereof may be more readily understood by one skilled in the art with reference being had to the following detailed description of several embodiments thereof, taken in conjunction with the accompanying drawings wherein like elements are designated by identical reference numerals throughout the several views, and in which.

DETAILED DESCRIPTION OF THE DRAWINGS

The present invention relates generally to a mask/wafer control structure, and also to an algorithm for placement of the mask/wafer control structures on the mask and chips on a wafer.

The subject invention provides for data placement of a measurement control structure called a PLS, Process Limiting Structure, on a mask and chips on a wafer.

The PLS measurement and control structure contains multiple representative features as well as easily findable/detectable targets for both mask and chip/wafer level production. The PLS control structure allows for a metrology of the most critical features in the level for the mask and the chip. The present invention advantageously positions PLS control structures at many locations throughout and across the field in both dense/isolated and sparse/nested areas; therefore, across field linewidth variation (ACLV) can be monitored through all stages of production, including mask exposure, mask etch, chip/wafer exposure and pattern transfer.

One advantage of the described PLS control structure strategy is that multiple representative measurement feature types are placed within the PLS design, such that all of the measurement structures are readily within a small proximity, within the PLS measurement structure.

Figure 1:
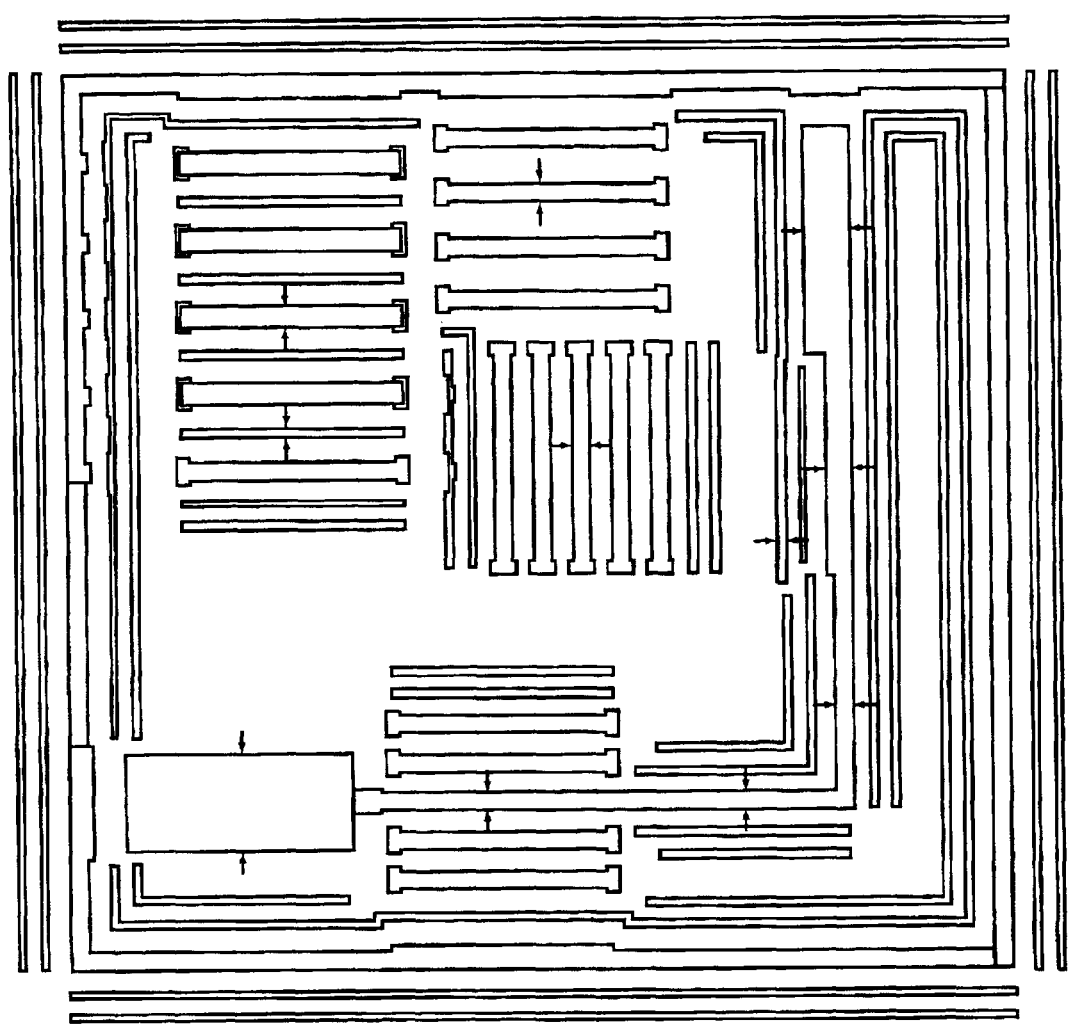
FIG. 1 illustrates an exemplary design of a PLS control structure for a PC (polysilicon conductor) level or layer of the wafer.

FIG. 1 illustrates an exemplary design of a PLS control structure for an OPC'd (polysilicon conductor) level or layer of the chip which includes multiple representative features such as isolated features along both axes, with various pitches and various linewidths.

Figure 2:
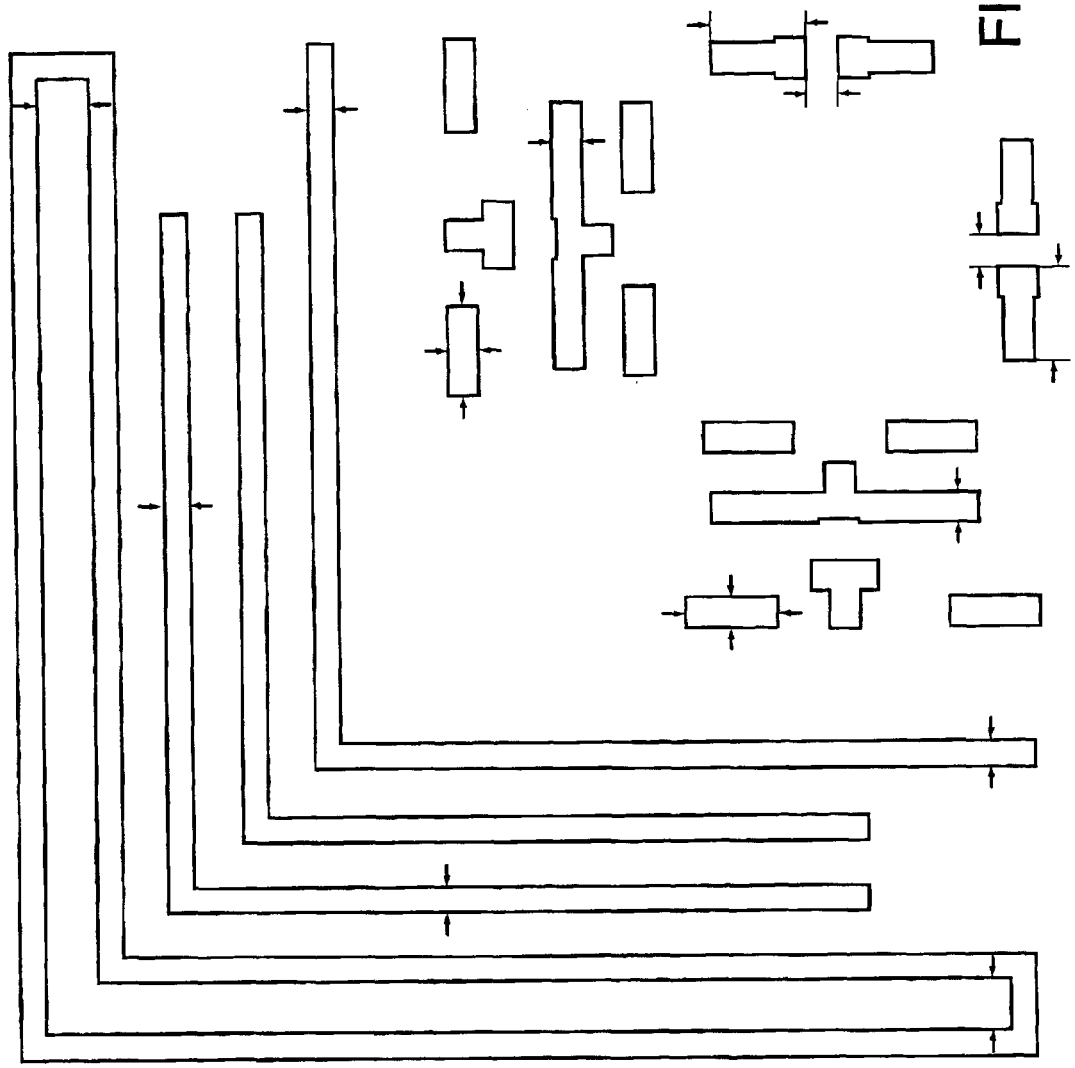
FIG. 2 illustrates an exemplary design of a PLS control structure for an MC (metal conductor) level or layer of the wafer.

FIG. 2 illustrates an exemplary design of a PLS control structure for an MC (metal contact) level or layer of the chip which includes multiple representative features such as isolated and nested lines and spaces along both axes, and short and long features.

As the PC_PLS design demonstrates, the PLS control structures are placed in the native data level of the mask that is being built. This allows for monitoring of all OPC (optical proximity correction) or data preparation (modifications in the nature of OPC and other modifications required to reproduce on a chip and wafer a design received from a customer) that may be done to the data of the native data level.

Implementation of the PLS control structures is performed through the shape manipulations of the data preparation.

In FIGS. 1 and 2, the opposing arrows indicate features which are monitored and measured to ensure reproducing on a chip and wafer a design as received from a customer.

The present invention provides an algorithm that allows for placement of the PLS control structures on a set periodicity where open real estate is available within the pre-existing data. In addition, the placement of the PLS control structures is aware of other data levels, such that it will not inadvertently cause any conflicts such as short or open circuits. Lastly, the periodicity of the PLS control structures can be manually defined such that the global character, or loading (density of features) of the chip is not changed significantly. If all "white space" (space without features) were to be used, PLS placement could exceed many thousands of instances, while only several dozen could realistically be measured.

The following is a description of the PLS control structure placement algorithm:

1) The design and nature of a product chip is analyzed to determine a suitable PLS control structure size, desired placement frequency, and a number of parameters describing placement criteria (i.e. what data levels of the chip to avoid and by how much of an avoidance margin) which are taken as input.

2) The available (empty) space in the chip in which PLS control structures may be placed is calculated using the placement criteria of step 1.

3) A grid of PLS control structure placement points is placed over the product chip at the desired placement frequency.

4) Each PLS control structure placement point that falls within the available space on the chip is maintained or kept and set aside for later output.

5) For each PLS control structure placement point that falls outside the available space (in an off-limits space) on the chip, a chord is calculated to the nearest available space within the surrounding PLS control structure placement points.

6) If there is no space available within the surrounding PLS control structure placement points, that PLS placement point is dropped.

7) If there is a space available within the surrounding PLS control structure placement points, the PLS control structure placement point is moved to this area and set aside for output.

8) The on-grid and off-grid points from 4) and 7) are checked to make sure they are valid and don't interfere or cause conflicts with each other or any other feature of the chip.

9) A PLS control structure is placed at each of these PLS control structure placement points.

Basically this PLS placement algorithm and process describe a compliant grid wherein grid points that occupy areas where PLS structures cannot be placed are moved to the nearest area that they can be placed in or are eliminated. This allows the maintenance of an approximate frequency of placement without having to conform to the rigid constraints of a strictly orthogonal grid.

Figure 3:
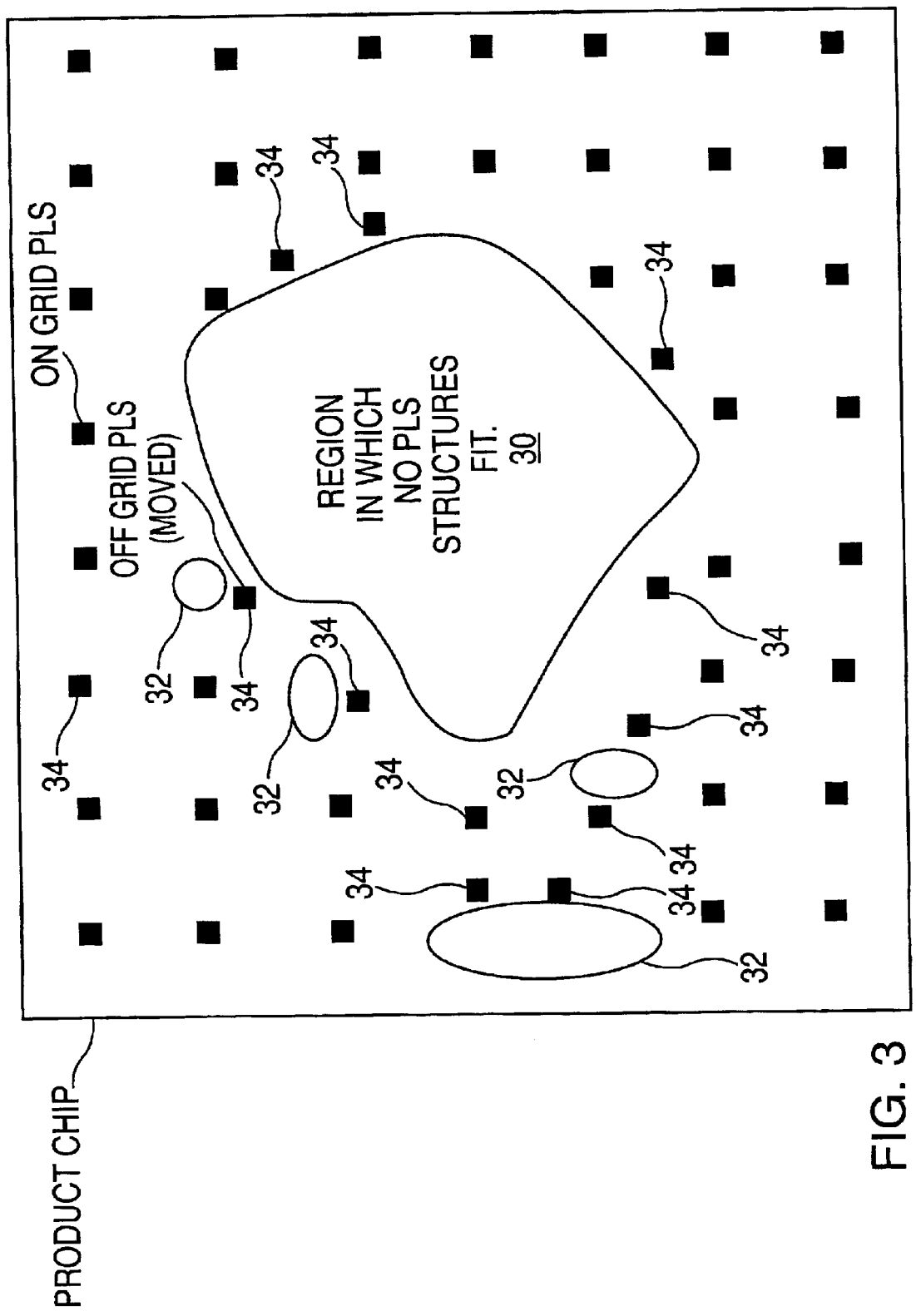
FIG. 3 is an illustration of a typical compliant grid of PLS control structures in a small product chip having a number of off-limits areas in which no PLS control structures fit or are allowed, and how the PLS control structure points of the original grid have been repositioned in a compliant grid manner to move them to positions adjacent to the off-limit areas.

FIG. 3 is an illustration of a typical compliant grid of PLS control structures in a small product chip having a large off-limits area 30 in which no PLS control structures fit or are allowed and four smaller off-limits areas 32 in which no PLS control structures fit or are allowed, and illustrates how the PLS control structure points 34 of the original regular grid have been repositioned in a compliant grid manner to move them to positions adjacent to the off-limit areas.

Figure 4:
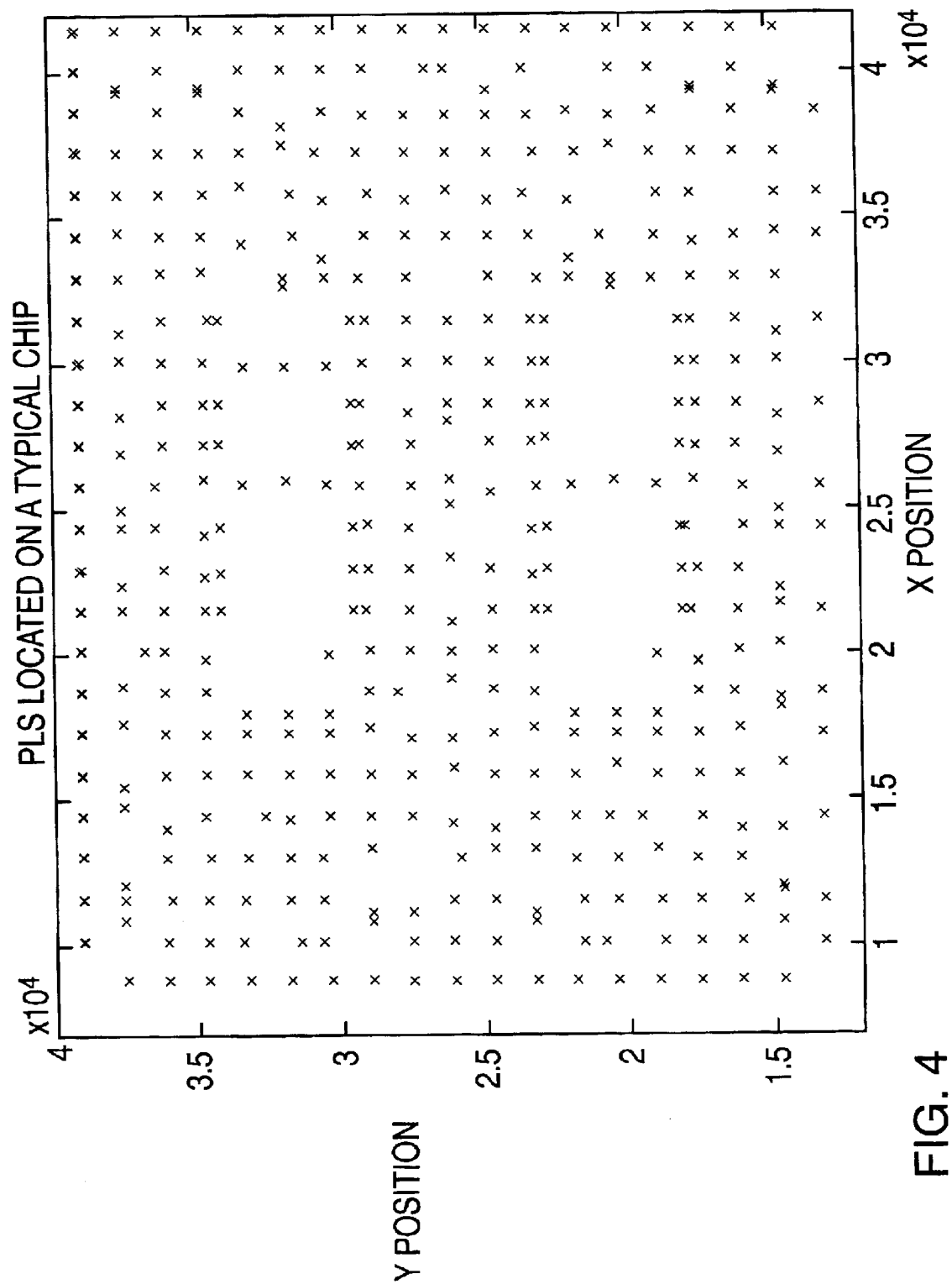
FIG. 4 illustrates an example of a typical map of the PLS control structure placement on a mask and demonstrates how a relatively large number of PLS control structure measurement locations are made available even though a functioning chip design is present at over 50% circuit pattern density.

FIG. 4 illustrates an example of a typical map of the PLS control structure placement points 40 on a wafer containing a plurality of chips, and illustrates how a relatively large number of PLS control structure measurement locations are made available, even though a functioning chip design is present at over 50% circuit density, by placing the structures with this algorithm, however the impact to the global loading can be contained to less than ½ of 1% on non filled levels, and 0 on filled levels.

Several reticles have been fabricated using the PLS control structure measurement structures and placement and measurement algorithms described herein. They have demonstrated a far superior characterization of the reticle than had previously been available. In addition, wafer level measurements have been taken to demonstrate manufacturability in both the wafer and mask lines.

While several embodiments and variations of the present invention for a mask/wafer control structure and algorithm for placement thereof are described in detail herein, it should be apparent that the disclosure and teachings of the present invention will suggest many alternative designs to those skilled in the art.

Having thus described our invention, what we claim as new and desire to secure by Letters Patent is:

1. A method of data placement of a measurement process limiting structure (PLS) on a photolithograph mask and a semiconductor chip, in a compliant grid comprising:

analyzing the design and nature of the semiconductor chip to determine a suitable PLS control structure size, desired placement frequency of the PLS control structures, and parameters describing placement criteria of the PLS control structures, wherein each PLS control structure contains multiple representative structures and measurement targets for both the photolithographic mask and production of the semiconductor chip using the photolithographic mask;

determining the available space on the semiconductor chip in which PLS control structures can be placed by using the placement criteria of the analyzing step;

creating a regular grid of PLS control structure placement points over the semiconductor chip at the desired placement frequency;

maintaining each PLS control structure placement point of the regular grid that falls within the determined available space on the semiconductor chip;

determining the nearest available space within surrounding PLS control structure placement points for each PLS control structure placement point of the regular grid that falls outside the determined available space on the semiconductor chip;

if no space is available within the surrounding PLS control structure placement points, deleting that PLS placement point;

if a space is available within the surrounding PLS control structure placement point, moving the PLS control structure placement point to the nearest available space, to design a compliant grid for the photolithograph mask and the semiconductor chip; and wherein the step of determining the nearest available space includes determining a chord to the nearest available space.

2. A method of data placement of a measurement process limiting structure (PLS) on a photolithograph mask and a semiconductor chip, in a compliant grid comprising:

analyzing the design and nature of the semiconductor chip to determine a suitable PLS control structure size, desired placement frequency of the PLS control structures, and parameters describing placement criteria of the PLS control structures, wherein each PLS control structure contains multiple representative structures and measurement targets for both the photolithographic mask and production of the semiconductor chip using the photolithographic mask;

determining the available space on the semiconductor chip in which PLS control structures can be placed by using the placement criteria of the analyzing step;

creating a regular grid of PLS control structure placement points over the semiconductor chip at the desired placement frequency;

maintaining each PLS control structure placement point of the regular grid that falls within the determined available space on the semiconductor chip;

determining the nearest available space within surrounding PLS control structure placement points for each PLS control structure placement point of the regular grid that falls outside the determined available space on the semiconductor chip;

if no space is available within the surrounding PLS control structure placement points, deleting that PLS placement point;

if a space is available within the surrounding PLS control structure placement points, moving the PLS control structure placement point to the nearest available space, to design a compliant grid for the photolithograph mask and the semiconductor chip; and wherein the step of analyzing includes determining particular levels of the semiconductor chip to avoid and a margin of avoidance for those particular levels of the semiconductor chip.

3. A method of data placement of a measurement process limiting structure (PLS) on a photolithograph mask and a semiconductor chip, in a compliant grid comprising:

analyzing the design and nature of the semiconductor chip to determine a suitable PLS control structure size, desired placement frequency of the PLS control structures, and parameters describing placement criteria of the PLS control structures, wherein each PLS control structure contains multiple representative structures and measurement targets for both the photolithographic mask and production of the semiconductor chin using the photolithographic mask;

determining the available space on the semiconductor chip in which PLS control structures can be placed by using the placement criteria of the analyzing step;

creating a regular grid of PLS control structure placement points over the semiconductor chip at the desired placement frequency;

maintaining each PLS control structure placement point of the regular grid that falls within the determined available space on the semiconductor chip;

determining the nearest available space within surrounding PLS control structure placement points for each PLS control structure placement point of the regular grid that falls outside the determined available space on the semiconductor chip;

if no space is available within the surrounding PLS control structure placement points, deleting the PLS placement point;

if a space is available within the surrounding PLS control structure placement points, moving the PLS control structure placement point to the nearest available space, to design a compliant grid for the photolithograph mask and the semiconductor chip; and wherein PLS control structure points are checked to ensure that they don't interfere with or cause conflicts, such as short or open circuits, with each other or any other feature of the semiconductor chip.

4. A method of data placement of a measurement process limiting structure (PLS) on a photolithograph mask and a semiconductor chip in a compliant grid comprising:

analyzing the design and nature of the semiconductor chip to determine a suitable PLS control structure size, desired placement frequency of the PLS control structures, and parameters describing placement criteria of the PLS control structures, wherein each PLS control structure contains multiple representative structures and measurement targets for both the photolithographic mask and production of the semiconductor chip using the photolithographic mask;

determining the available space on the semiconductor chip in which PLS control structures can be placed by using the placement criteria of the analyzing step;

creating a regular grid of PLS control structure placement points over the semiconductor chip at the desired placement frequency;

maintaining each PLS control structure placement point of the regular grid that falls within the determined available space on the semiconductor chip;

determining the nearest available space within surrounding PLS control structure placement points for each PLS control structure placement point of the regular grid that falls outside the determined available space on the semiconductor chip;

if no space is available within the surrounding PLS control structure placement points, deleting that PLS placement point;

if a space is available within the surrounding PLS control structure placement points, moving the PLS control structure placement point to the nearest available space, to design a compliant grid for the photolithograph mask and the semiconductor chip; and wherein the PLS control structures are used for control during fabrication of the photolithographic mask, and are used for control during fabrication of a semiconductor wafer which contains a plurality of semiconductor chips.

5. A method of data placement of a measurement process limiting structure (PLS) on a photolithograph mask and a semiconductor chip in a compliant grid comprising:

analyzing the design and nature of the semiconductor chip to determine a suitable PLS control structure size, desired placement frequency of the PLS control structures, and parameters describing placement criteria of the PLS control structures, wherein each PLS control structure contains multiple representative structures and measurement targets for both the photolithographic mask and production of the semiconductor chip using the photolithographic mask;

determining the available space on the semiconductor chip in which PLS control structures can be placed by using the placement criteria of the analyzing step;

creating a regular grid of PLS control structure placement points over the semiconductor chip at the desired placement frequency;

maintaining each PLS control structure placement point of the regular grid that falls within the determined available space on the semiconductor chip;

determining the nearest available space within surrounding PLS control structure placement points for each PLS control structure placement point of the regular grid that falls outside the determined available space on the semiconductor chip;

if no space is available within the surrounding PLS control structure placement points, deleting that PLS placement point;

if a space is available within the surrounding PLS control structure placement point moving the PLS control structure placement point to the nearest available space, to design a compliant grid for the photolithograph mask and the semiconductor chip; and wherein the PLS control structures contain representative worst-case allowable features.

6. The method of claim 5, wherein the PLS control structures also contain conventional control features.

* * * * *